United States Patent [19]
DeBra et al.

[11] Patent Number: 5,209,402
[45] Date of Patent: May 11, 1993

[54] LAMINAR FLOW GAS DIFFUSER

[75] Inventors: Daniel B. DeBra, Los Altos; William A. Eckes, Castro Valley, both of Calif.

[73] Assignee: Etec System, Inc., Castro Valley, Calif.

[21] Appl. No.: 705,227

[22] Filed: May 24, 1991

[51] Int. Cl.⁵ .............................................. B05B 1/26
[52] U.S. Cl. ....................... 239/1; 239/499; 239/524; 454/310
[58] Field of Search ............... 239/499, 502, 504, 524, 239/1; 454/284, 292, 300, 310; 432/253; 118/715, 725

[56] References Cited

U.S. PATENT DOCUMENTS

| | | | |
|---|---|---|---|
| 2,909,866 | 10/1959 | Blue | 239/504 |
| 3,205,809 | 9/1965 | Sweeney et al. | 454/300 |
| 4,142,456 | 3/1979 | Locker | 239/502 |

FOREIGN PATENT DOCUMENTS

| | | | |
|---|---|---|---|
| 60905 | 4/1948 | Netherlands | 239/502 |
| 153423 | 6/1932 | Switzerland | 454/310 |
| 294055 | 1/1971 | U.S.S.R. | 454/310 |
| 635368 | 11/1978 | U.S.S.R. | 454/300 |

OTHER PUBLICATIONS

Daniel B. DeBra, "Design of Laminar Flow Restrictors for Dampling Pneumatic Vibration Isolators," CIRP 34th General Assembly, Aug. 1984, pp. 1-22.

*Primary Examiner*—Gregory L. Huson
*Assistant Examiner*—Karen B. Merritt
*Attorney, Agent, or Firm*—Skjerven, Morrill, MacPherson, Franklin & Friel

[57] ABSTRACT

A laminar flow diffuser has a plurality of round, thin, stacked plates. A central bore penetrates all the plates with the exception of the bottom plate. The diffuser is secured to the vacuum chamber port. When gas enters the port, it enters the central bore and then flows radially outward through the interplate spaces to the outer circumference of the plates and subsequently into the periphery of the chamber. The diffuser thereby provides a controlled laminar flow which prevents turbulence in the chamber and hence, reduces the possibility of contamination to the workpiece in the chamber. The laminar flow diffuser is easily cleaned, both during its initial assembly and later after use, because it chiefly has flat surfaces which do not harbor dirt or gas.

14 Claims, 3 Drawing Sheets

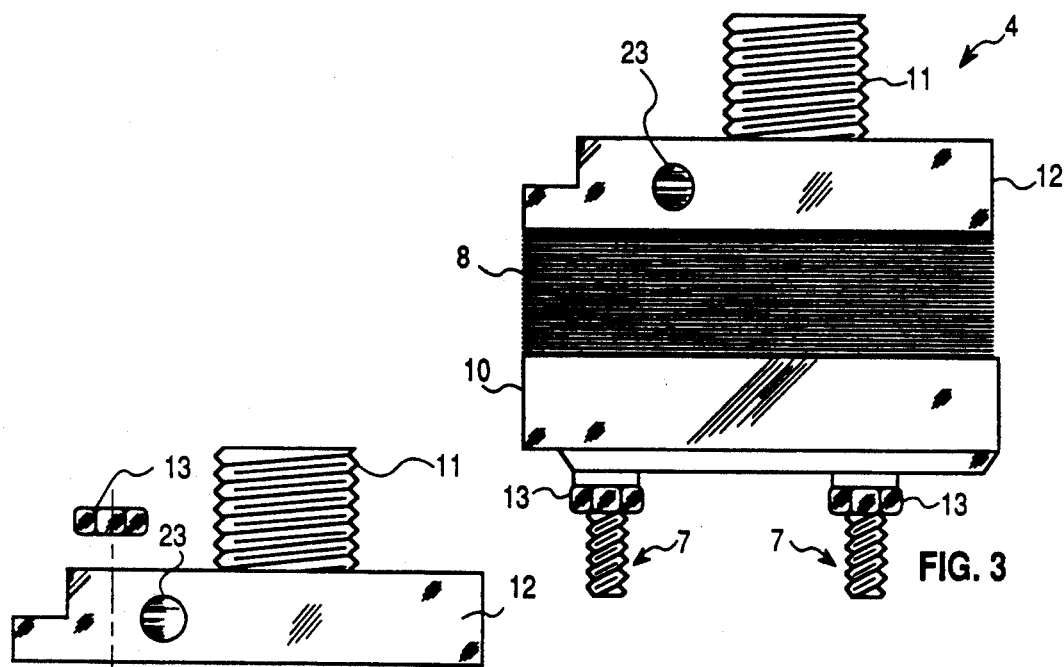
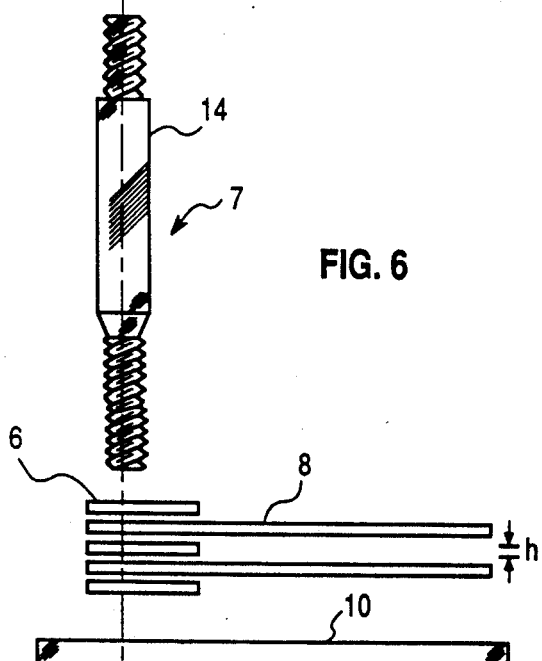
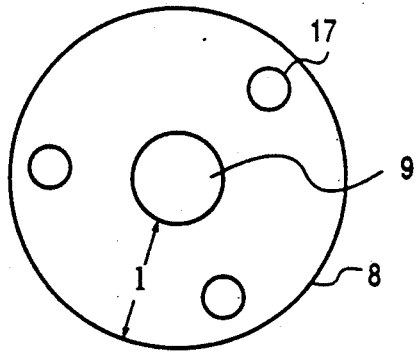
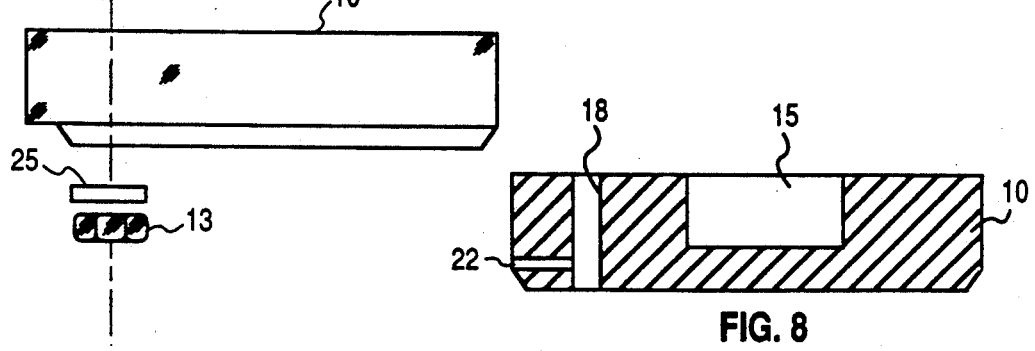

LAMINAR FLOW GAS DIFFUSER

BACKGROUND OF THE INVENTION

1. Field of the Invention

This invention relates to diffusion of fluids so as to provide laminar flow. More specifically, the invention relates to a device and method for diffusing gases which are flowing into a vacuum chamber so as to create laminar flow and thereby eliminate turbulence inside the chamber.

2. Description of the Prior Art

In semiconductor fabrication, exposure of masks or chip substrates, hereinafter workpieces, to electron and/or ion beams is typically done in a vacuum chamber. However, to move workpieces in and out of the chamber, the vacuum must be broken, thereby bringing the chamber back to atmospheric pressure. Allowing a large quantity of atmospheric pressure gas to quickly flow into the vacuum chamber is desirable in order to decrease fabrication time, thereby decreasing cost.

However, the rapid ingress of gas into the vacuum chamber also causes turbulence therein. Frequently, despite contamination control procedures, a few microscopic dust particles are still present in the chamber. Hence, such turbulence stirs up these dust particles.

Because of the small feature sizes and the thinness of deposited layers, semiconductor devices are particularly vulnerable to contaminants such as dust particles. Specifically, if dust particles settle on the workpiece, the electrical characteristics of the device may be dramatically changed resulting in reduced performance and reliability.

To eliminate the problem of turbulence, the prior art provided a diffuser device at the entranceway of the chamber. Typically, the diffuser device was a sintered diffuser, i.e. a mesh-like body forming a porous structure, which allowed the in-flowing gas to flow through the mesh and thus diffused the gas into a laminar flow. The laminar flow of the gas into the chamber reduced the probability that dust particles would contaminate the workpiece.

However, these sintered-type diffusers have significant numbers of "dead" spaces because of their porous nature. These dead spaces, i.e. the spaces between the mesh, are virtually impossible to clean properly both during fabrication of the diffuser and during its use. Moreover, these dead spaces tend to trap gas, thereby making it very difficult to achieve a hard vacuum which is desirable of semiconductor fabrication.

Also known in the prior art are multiple orifice-type diffusers which merely serve to reduce gas velocity. These diffusers are very difficult to clean because of the large number of orifices which tend to trap dust particles. Furthermore, these orifice-type diffusers must be quite large in order to provide an appropriate flow rate, thereby reducing valuable utility space in the chamber.

Therefore, there is a need for a diffuser in vacuum systems, or other systems, which provides the needed diffusion of gas and also is simple to clean, both during fabrication and after use inside the vacuum chamber.

SUMMARY OF THE INVENTION

In accordance with the present invention, a laminar flow diffuser is provided which comprises a large number of thin plates which are stacked with small spaces provided therebetween. A central bore is formed through all of the plates with the exception of the last plate. The gas entering the vacuum chamber flows through the central bore and then through the spaces between the plates into the periphery of the chamber. This radial dispersion of the gas from the central bore along the interplate spaces out to the circumference of the chamber provides the desired laminar flow.

Additionally, because the plates are flat, there are no dust or gas collecting areas in the diffuser, thereby facilitating cleaning both during initial assembly and after use. Moreover, this diffuser is inexpensive to fabricate and is relatively simple to assemble/disassemble.

It should be apparent that square flat plates, concentric cylinders and other geometries provide alternate embodiments which effect the same laminar flow and control of inlet velocity.

This invention will be more fully understood in conjunction with the following detailed description taken together with the following drawings.

BRIEF DESCRIPTION OF THE DRAWINGS

FIG. 3 shows a side view of a second embodiment of an assembled laminar flow diffuser.

FIG. 6 illustrates an exploded view of part of the second embodiment of the laminar flow diffuser.

FIG. 7 shows a planar view of a typical diffuser plate for use in a laminar flow diffuser.

FIG. 8 illustrates a cross-sectional view of one embodiment of a bottom plate used in the laminar flow diffuser.

DETAILED DESCRIPTION OF THE INVENTION

Figure 1:
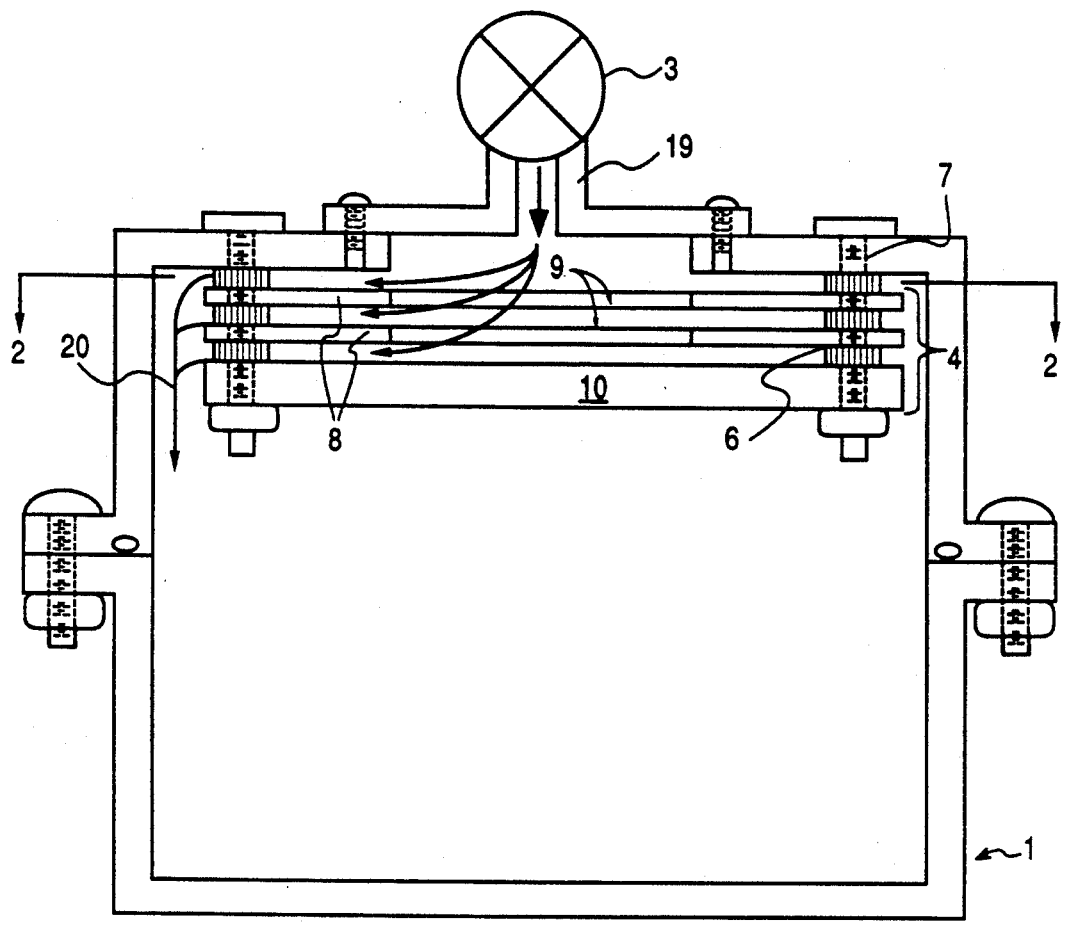
FIG. 1 shows a cross-sectional view of a first embodiment of a laminar flow diffuser secured to a vacuum chamber.

FIG. 1 shows a cross-section of an typical vacuum chamber 1 with a conventional entry port 19 secured to vacuum chamber 1. A valve 3 is provided at the top of entry port 19 for allowing gas to enter or leave vacuum chamber 1. In accordance with the present invention, a laminar flow diffuser 4 is provided immediately below entry port 19 at the upper portion of vacuum chamber 1.

As shown, laminar flow diffuser 4 comprises a plurality of circular diffuser plates 8 (only two of which are shown for simplicity) which are stacked and spaced apart by spacers 6. A central bore 9 is drilled through each diffuser plate 8, with the exception of bottom plate 10.

Typically, three bolts 7 penetrate through each diffuser plate 8 (only two such bolts are shown in this cross-section). Bolts 7 attach laminar flow diffuser 4 to vacuum chamber 1 and also secure diffuser plates 8 and bottom plate 10. In one embodiment, spacers 6 are washers of a predetermined thickness which will be explained in more detail hereinafter. As shown by arrows 20 of FIG. 1, when the vacuum inside vacuum chamber 1 is broken, gas is allowed to enter through valve 3 and flow through entry port 19 into central bore 9. Bottom plate 10 forces the gas to diffuse out in the spaces between diffuser plates 8 towards the periphery of vacuum chamber 1. This diffusion creates the desired laminar flow thereby reducing any turbulence which might result in contamination of the workpiece in vacuum chamber 1.

Figure 2:
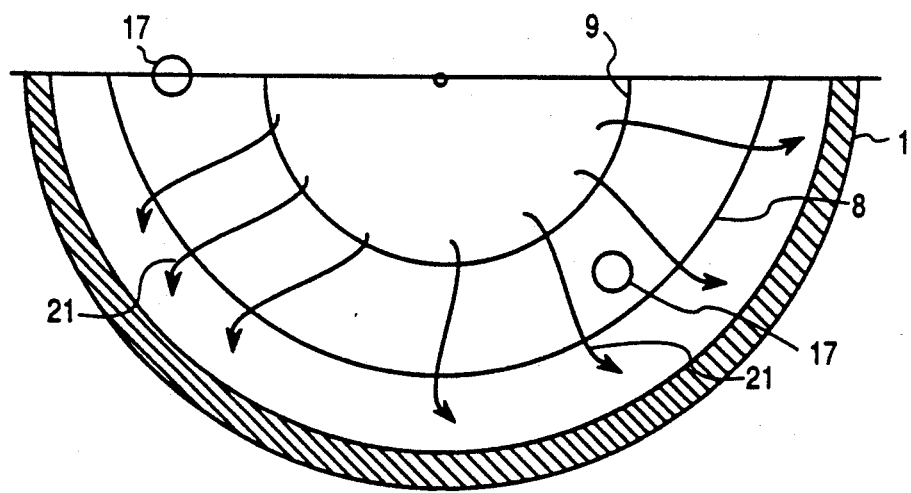
FIG. 2 illustrates a cross-section along line 2—2 of FIG. 1 illustrating a partial planar view of gas flowing over a diffuser plate in a laminar flow diffuser.

FIG. 2 illustrates a partial planar view (along line 2—2 of FIG. 1) of typical gas flow along a diffuser plate 8 in vacuum chamber 1. Arrows 21 show how gas flows from central bore 9 radially outward towards the outside circumference of diffuser plate 8 and subsequently towards the periphery of chamber 1. Holes 17 are for bolts 7 (not shown).

FIG. 3 illustrates a side view of one embodiment of the present invention. As shown in FIG. 3, laminar flow diffuser 4 includes an upper threaded channel II which may be threaded, for instance, into entry port 19 of vacuum chamber 1. Channel 11 is integral to an upper plate 12. A large number of thin, stacked, spaced diffuser plates 8 are positioned by bolts 7 between upper plate 12 and lower plate 10. In one embodiment of the present invention, fifty diffuser plates 8 are each spaced apart with washers by approximately four thousandths of an inch (0.1016 mm). Other embodiments may use five to a hundred diffuser plates. In accordance with the present invention, the greater the number of diffuser plates, the greater the allowed flow rate of gas into the vacuum chamber.

Figure 4:
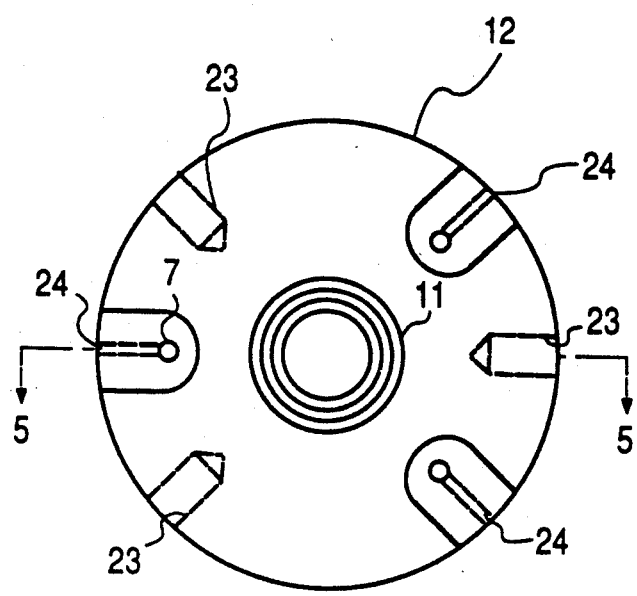
FIG. 4 illustrates a planar view of one embodiment of an upper plate used in the laminar flow diffuser.

FIG. 4 illustrates a planar view of upper plate 12 shown in FIG. 3. Three assembly bores 23 are drilled into upper plate 12 to facilitate screwing channel 11 into entry port 19 (see FIG. 1). Having assembly bores 23 in upper plate 12 insures that no stress is transferred to the thin diffuser plates. Assembly bores 23, in one embodiment, are 0.250 inch (6.35 mm) in diameter. Three venting bores 24 are also drilled in upper plate 12 to extend to bolts 7. These venting bores 24 insure there are no trapped volumes to harbor gas or contaminants.

Figure 5:
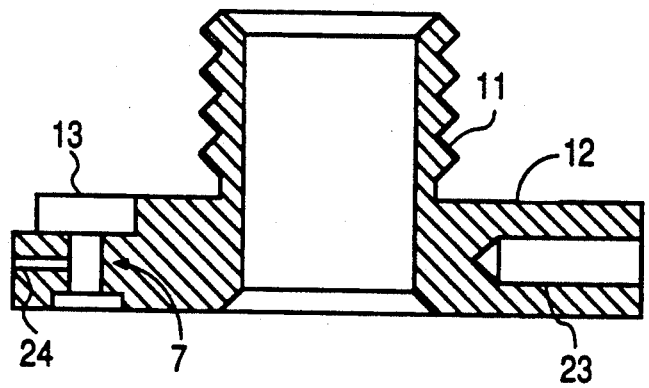
FIG. 5 shows a cross-section along line 5—5 of FIG. 4 illustrating one embodiment of the upper plate.

FIG. 6 shows an exploded view of part of the embodiment illustrated in FIG. 3 which provides further details of each of bolts 7. Bolt 7 includes a cylindrical post 14 with a screw thread on both ends to receive nuts 13. Note that lock washer 25 is interposed between nut 13 and bottom plate 10 to insure a stable unit. FIG. 5 illustrates how nut 13 of bolt 7 is recessed into upper plate 12. In this manner, the laminar flow diffuser 4 of this embodiment (when screwed via channel 11 into entry port 19 (FIG. 1) is flush with vacuum chamber 1.

FIG. 7 shows a top view of a typical diffuser plate 8 with three penetration holes 17 bored around its circumference for receiving of bolts 7. (See also FIG. 2.) In one embodiment, plate 8 is two inches (50.8 mm) in diameter and central bore 9 is 0.5 inch (12.7 mm) in diameter. The penetration holes 17 for bolts 7 may be of any convenient size, for example, approximately 0.25 (6.35 mm) inch in diameter. In this embodiment of the present invention, diffuser plate 8 is approximately 0.01 inch (0.254 mm) thick. Upper plate 12, although having the identical diameter and penetration hole dimensions of diffuser plates 8, is generally much thicker in order to include assembly bores 23 (see FIG. 5). In the embodiment shown in FIGS. 3, 4, and 5, top plate 12 is approximately 0.375 inch (9.525 mm) thick. Bottom plate 10 also has the identical diameter and penetration hole dimension of diffuser plates 5 while having a thickness, in this embodiment, of approximately 0.5 inch (12.7 mm).

As previously noted, bottom plate 10 does not have central bore 9. Therefore, in one embodiment, bottom plate 10 is a flat disk. In another embodiment, as shown in FIG. 8, a bore 15 of 0.5 inch (12.7 mm) in diameter may extend into bottom plate 10, but not penetrate the plate. In this manner, any dust particles present in entry port 19 or clinging to the inside diameter of diffuser plates 8 will be trapped by and retained in bore 15. Venting bore 22 extending to hole 18 (for receiving bolt 7) serves the same purpose as venting bores 24 described above in reference to FIG. 4.

The above-mentioned dimensions are illustrative only.

To create laminar flow and low velocities in the chamber one must find a balance of how quickly the air is readmitted to the chamber and how high a velocity is acceptable. A characteristic time t can be chosen as say 1/10 of the fill time from which a which a maximum volumetric flow Q is estimated knowing the chamber volume V using the equation below $$Q = V/t \tag{1}$$

The total entrance width w which is the sum of the entrance width of all the channels determines both the maximum velocity v and the Reynolds number Re which should be less than about 500 for laminar flow. One uses the greater value of the calculations in the equations 2 or 3 below;

$$w = Q/v \tag{2}$$

$$w = Q\rho/Re\,\mu \tag{3}$$

where $\rho$ is the density of air and $\mu$ is its viscosity. The flow resistance R needed to limit Q to the desired value is calculated from the highest pressure drop p which will typically be atmospheric pressure using equation 4.

$$R = p/Q \tag{4}$$

To avoid entrance conditions, the channel length 1 (see FIG. 7) should be about 100 to 1000 times the channel height h (see FIG. 6). Thus, using equation 5, one gets an estimate of h.

$$h^2 = (l/h)\,12\,\mu/w\,R \tag{5}$$

A satisfactory design can be iterated from there. Eq. 5 is based on a parallel channel, whereas flow diverges in the preferred embodiment. More accurate formulas are available, and well known to those practiced in the art or one may be conservative in choosing dimensions and apply the simpler expressions given above. Experimental data support the validity of the formulas given to the accuracy needed.

Although diffuser plates 8 are typically fabricated of stainless steel, any material compatible with high vacuum conditions and easily cleaned is suitable. Diffuser plates 8 are electro polished and carefully conventionally cleaned before assembly to eliminate any rough surfaces which may harbor contaminants. Moreover, after having been in use for a while, the laminar flow diffuser of the present invention may be easily disassembled and cleaned so as to eliminate all contaminants. Hence, the device, fabricated so as to eliminate any dead spaces which might accumulate dust and/or gas, is suitable for use in a vacuum system where both cleanliness and hard vacuum are required.

The above description is illustrative and not limiting. For example, the diffuser in accordance with the present invention is applicable not only to vacuum systems where gas is entering, but also to systems where diffusion of other fluids is desired. Further modifications of the invention will be apparent to one of ordinary skill in the art in the light of this disclosure and the claims.

We claim:

1. A diffuser for diffusing a fluid into a chamber via an opening in said chamber comprising:
   a top plate having a passage therein for entry of said fluid;
   a bottom plate;
   a plurality of intermediate plates positioned between said top and bottom plates; and
   means for supporting said plurality of intermediate plates,
   wherein said intermediate plates each have substantially equal surface areas,
   wherein for a predetermined surface area of said intermediate plates, a spacing between adjacent intermediate plates creates a laminar flow of said fluid into said chamber.

2. A diffuser of claim 1 wherein each of said plurality of intermediate plates defines a central bore and adjacent plates are spaced apart with spacers.

3. A diffuser of claim 2 wherein said means for supporting comprises a plurality of bolts for positioning said plates.

4. A diffuser of claim 1 wherein the entry of said fluid through said opening in said chamber is perpendicular to the planes defined by said intermediate plates.

5. A diffuser for diffusing a fluid into a chamber via an opening in said chamber comprising:
   a top plate having a passage therein for entry of said fluid;
   a bottom plate;
   diffusing means positioned intermediate said top and bottom plates for diffusing said fluid into said chamber in a laminar flow; and
   means for supporting said diffusing means intermediate said top plate and said bottom plate,
   wherein said means for diffusing comprising a plurality of plates each having a central bore therein and spaced apart with spacers,
   wherein said means for supporting comprises a plurality of bolts for positioning said plates, and
   wherein a ratio of a dimension defined by a distance between a periphery of said central bore and an outside edge of at least one of said plates to a thickness of one of said spacers is in the range of about 100 to about 1,000, thereby creating said laminar flow.

6. A diffuser for diffusing a fluid into a chamber via a passage in a wall of said chamber comprising:
   a bottom plate interior to said chamber;
   a plurality of intermediate plates positioned between said passage in said wall and said bottom plate; and
   means for positioning said bottom plate and said diffusing means to said wall adjacent to said passage,
   wherein said intermediate plates each have substantially equal surface areas,
   wherein for a predetermined surface area, a predetermined spacing range between adjacent intermediate plates creates a laminar flow of said fluid into said chamber.

7. A diffuser of claim 6 wherein each of said plurality of intermediate plates defines a central bore and adjacent plates are spaced apart with spacers.

8. A diffuser of claim 7 wherein said means for positioning comprises a plurality of bolts.

9. A diffuser for diffusing a fluid into a chamber via a passage in a wall of said chamber comprising:
   a bottom plate interior to said chamber;
   diffusing means positioned intermediate said passage in said wall and said bottom plate; and
   means for positioning said bottom plate and said diffusing means to said wall adjacent said passage,
   wherein said means for diffusing comprises a plurality of circular plates each having a central bore therein and being spaced apart with spacers,
   wherein said means for positioning comprises a plurality of bolts, and
   wherein a ratio of a dimension defined by a distance between a periphery of said central bore and an outside diameter of said circular plates to a thickness of said spacers is about 100 to about 1,000, thereby creating said laminar flow.

10. A method for diffusing a fluid into a chamber comprising:
    providing said chamber with a plurality of parallel spaced apart plates each having substantially equal surface area;
    introducing said fluid into said chamber; and
    creating a laminar flow of said fluid by directing said fluid through spaces between said plates.

11. A method of claim 10 wherein introducing said fluid comprises:
    limiting a flow rate of said fluid into said chamber to a predetermined value.

12. Method of claim 11 wherein each of said plates has an associated length and width, and wherein directing said fluid comprises:
    providing a channel height between any two adjacent plates which is a function of said length and width.

13. A diffuser for diffusing a fluid into a chamber via an opening in said chamber comprising:
    a top plate having a passage therein for entry of said fluid;
    a bottom plate; and
    diffusing means supported between said top and bottom plates for diffusing said fluid into said chamber in a laminar flow,
    wherein said diffusing means comprises a plurality of plates each having a central bore and spaced apart with spacers,
    wherein a ratio of a dimension defined by a distance between a periphery of said central bore and an outside edge of said plates to a thickness of one of said spacers is in the range of about 100 to about 1,000, thereby creating said laminar flow.

14. A diffuser for diffusing a fluid into a chamber via a passage in the wall of said chamber comprising:
    a bottom plate interior to said chamber; and
    diffusing means positioned intermediate said passage in said wall and said bottom plate,
    wherein said diffusing means comprises a plurality of plates each defining a center bore and being spaced apart with spacers,
    wherein a ratio of a dimension defined by a distance between a periphery of said central bore and an outside diameter of said plates to a thickness of said spacers is about 100 to about 1,000, thereby creating said laminar flow.

* * * * *